(12) United States Patent
Krieger et al.

(10) Patent No.: US 6,249,137 B1
(45) Date of Patent: Jun. 19, 2001

(54) CIRCUIT AND METHOD FOR PULSED RELIABILITY TESTING

(75) Inventors: Gedaliahoo Krieger, Rehovot (IL); Yongbum Cuevas, Los Gatos, CA (US)

(73) Assignee: Qualitau, Inc., Sunnyvale, CA (US)

( * ) Notice: Subject to any disclaimer, the term of this patent is extended or adjusted under 35 U.S.C. 154(b) by 0 days.

(21) Appl. No.: 09/418,093

(22) Filed: Oct. 14, 1999

(51) Int. Cl.[7] .................................................. G01R 31/28
(52) U.S. Cl. ............................. 324/765; 324/158.1
(58) Field of Search .................................. 324/765, 763, 324/158.1, 73.1; 714/728, 733, 731; 438/14, 17, 18; 257/40, 48

(56) References Cited

U.S. PATENT DOCUMENTS

| | | | |
|---|---|---|---|
| 4,670,877 | * | 6/1987 | Nishibe ................................ 714/728 |
| 5,257,231 | * | 10/1993 | Masuda ................................ 365/201 |
| 5,463,315 | * | 10/1995 | Grace ................................ 324/158.1 |
| 5,731,700 | * | 3/1998 | McDonnald ........................ 324/158.1 |

* cited by examiner

*Primary Examiner*—Vinh P. Nguyen
(74) *Attorney, Agent, or Firm*—Townsend and Townsend and Crew LLP; Henry K. Woodward

(57) ABSTRACT

A test circuit for applying bipolar current pulse to first and second terminals of device under test (DUT) includes a first DC current source and a first switch having a first common terminal, a second DC current source and a second switch having a second common terminal, and means for connecting a device under test between the first and second common terminals. A timing generator selectively controls conduction of the first switch and the second switch whereby when the first switch is closed the current from the second DC current source flows through the device under test and the first switch to a circuit ground, and when the second switch is closed the current from the first DC current course flows through the device under test and the second switch to a circuit ground. Pulse repetition rate and duty cycle of the current pulses are controlled by the control voltage pulses from the timing generator.

15 Claims, 2 Drawing Sheets

- $\delta_1$: Ringing
- $\delta_2$: Overshoot
- $A$: Pulse Amplitude $$td \equiv \frac{T - 2tp}{2}$$

$$T \equiv 1/f$$

CIRCUIT AND METHOD FOR PULSED RELIABILITY TESTING

BACKGROUND OF THE INVENTION

This invention relates generally to reliability testing of electrical devices, and more particularly the invention relates to current pulse testing of electrical devices such as semiconductor components.

Semiconductor reliability tests require continuous application of electrical stimulus, usually at a controlled temperature ranging from −50° C. to +350° C. based on the specific test parameter (e.g., Hot Carrier, Electromigration). For electromigration test in particular, testing using DC current has always been the preferred approach due to simplicity, built-in conservatism, and relatively low cost. However, recent advances in process miniaturization have rendered DC tests insufficient, thus making similar testing under pulsed conditions a necessity.

An ideal pulsed stimulus should allow flexible control of Pulse-Repetition-Rate, Duty-Cycle, Polarity, and Intensity (Amplitude). These parameters are illustrated in FIGS. 1A and 1B where T is the period, frequency (f) is the pulse repetition rate (Hz), duty cycle is 2tp/T; positive amplitude is Ap, and negative amplitude is An (Volt, Amp). Further, while applications such as Hot Carrier (HC) and Time to Dielectric Breakdown (TDDB) require voltage stimulus, Electromigration requires a current pulse-train, which is a more difficult waveform to generate.

Conventional methods require relatively complex circuitry for each current source, as one source is needed for each DUT. While the intended use of the pulsed technique is limited to pulse-repetition-rates of several Mega-Cycle-per-Second (MHz), the required rectangular shape with a minimal overshoot and ringing, as illustrated in FIG. 2, is still difficult to meet. This requires that the pulse generating circuitry be very close to the DUT, a requirement difficult to meet especially when DUT temperatures are to be controlled up to 350° C. Thus, reliability tests and electromigration test in particular require complex rectangular pulses, which are capable of driving currents below one milliampere to more than 0.1 ampere under load conditions varying from one Ohm to several kilo-Ohms, all with the above described requirements. Designing such a system based on conventionally available techniques inevitably increases circuit complexity, cost, physical size (footprint) and a compromise on pulse quality to a point where such systems become impractical.

The present invention is directed to achieving a higher quality pulsed reliability test system in which a bipolar pulse waveform is generated close to the DUT by using a dual configuration of high quality DC sources.

SUMMARY OF THE INVENTION

Briefly, the invention is an electrical test system which combines two DC current sources connected to two terminals of a DUT with a fast shunting circuit connected to each terminal, and a timing generator controlling the shunt circuits.

More particularly, the test circuit includes a first DC current source serially connected with a first switch and having a first common terminal, a second DC current source serially connected with a second switch and having a second common terminal, and means for connecting a DUT between the first and second terminals. A timing generator is provided for controlling the conductance of the first switch and the second switch whereby when the first switch is closed current from the second DC current source flows through the DUT and the first switch, and when the second switch is closed current from the first DC current source flows through the DUT and the second switch. Pulse repetition rate and duty cycle of the current pulses are readily controlled by the control voltage pulses from the timing generator. At least one pair of back-to-back diodes can be serially connected with the DUT to limit leakage current through the DUT. Further, at least one resistor can be serially connected with the DUT to limit current pulse overshoot and ringing.

The invention and objects and features thereof will be more readily apparent from the following detailed description and appended claims when taken with the drawings.

DETAILED DESCRIPTION OF ILLUSTRATIVE EMBODIMENTS

Figure 1A:
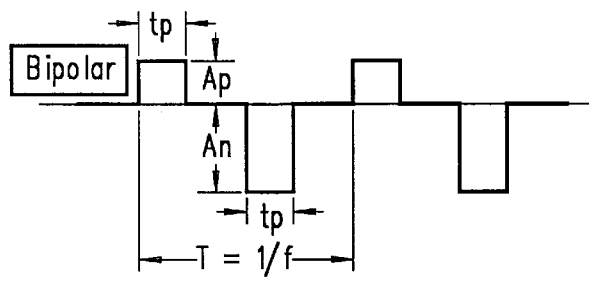
FIGS. 1A, 1B illustrate bipolar pulses and unipolar pulses, respectively, useful in testing electronic components.
Figure 1B:
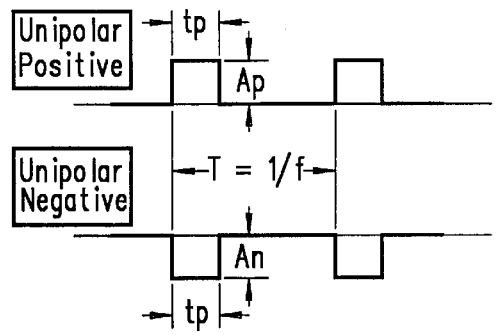
Figure 2:
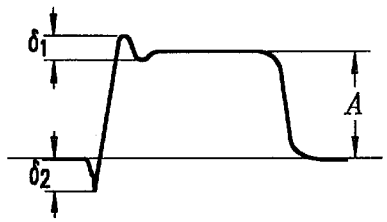
FIG. 2 illustrates a current pulse with ringing and overshoot.
Figure 3:
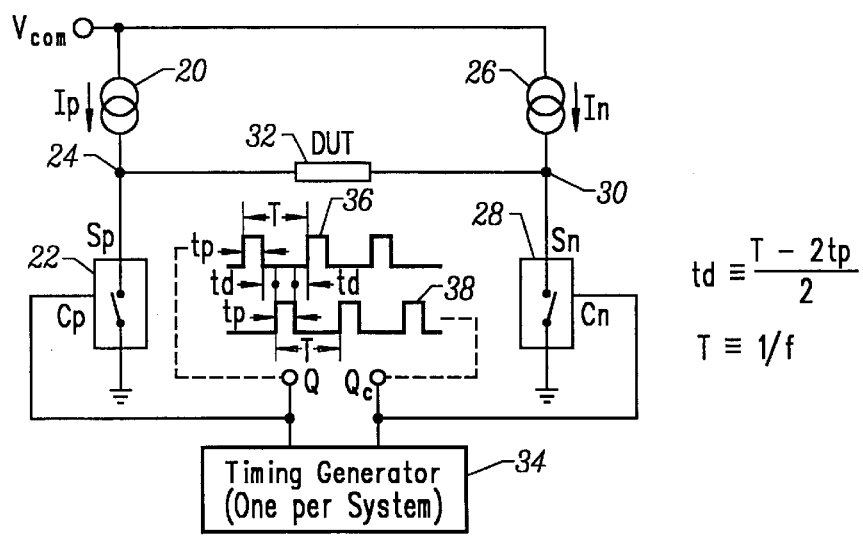
FIG. 3 is a schematic of a test circuit in accordance with one embodiment of the invention.

Referring now to the drawings, FIG. 3 is a schematic of a test circuit in accordance with one embodiment of the invention. The circuit includes a first current source 20 serially connected through a first electronic switch 22 to a circuit ground with current source 20 and switch 22 having a common terminal 24. A second current source 26 is serially connected with a second electronic switch 28 to circuit ground with current source 26 and switch 28 having a common terminal 30. A DUT 32 is connected between the common terminals 24 and 30 with current source 20 providing a positive current, Ip, through DUT 32 and with current source 26 providing a negative current, In through DUT 32. Suitable current sources and electronic switches are well known in the art. Control of switches 22, 28 is effected by a timing generator 34 which applies control voltage pulses 36 at terminal Q to control the conduction of electronic switch 22 and voltage control pulses 38 at terminal Qc to control the conduction of electronic switch 28. As illustrated, pulses 36 and 38 are spaced so that pulses 36 do not overlap pulses 38. The time period, T, is 1/f of the desired current pulses through DUT 32, and time between pulses, td, is given by $$td = \frac{T - 2tp}{2}$$

The two similar DC current sources 20, 26 deliver the required positive and negative currents, $I_p$ and $I_n$, respectively, in response to conduction of electronic switches 22, 28. Switches 22, 28 are identical electronic switches and are connected to each side of the device under test with the switches designed to provide near zero impedance path to circuit ground when driven by a high voltage from the timing generator at the control inputs. Similarly, the electronic switches have a very high impedance (at least several Mega-Ohms) when driven by low voltage. Timing generator 34 generates a positive pulse-train between zero (ground) and a voltage level required to switch the electronic switches to their low-impedance state. The only controlled parameters are the period T and the related pulse-width, tp. The two signals 36, 38, shifted by td with respect to each other are delivered to the control-inputs of the electronic switches 22, 28. Timing generator 34 can drive many circuits and act as a common resource for an entire test system.

Figure 4A:
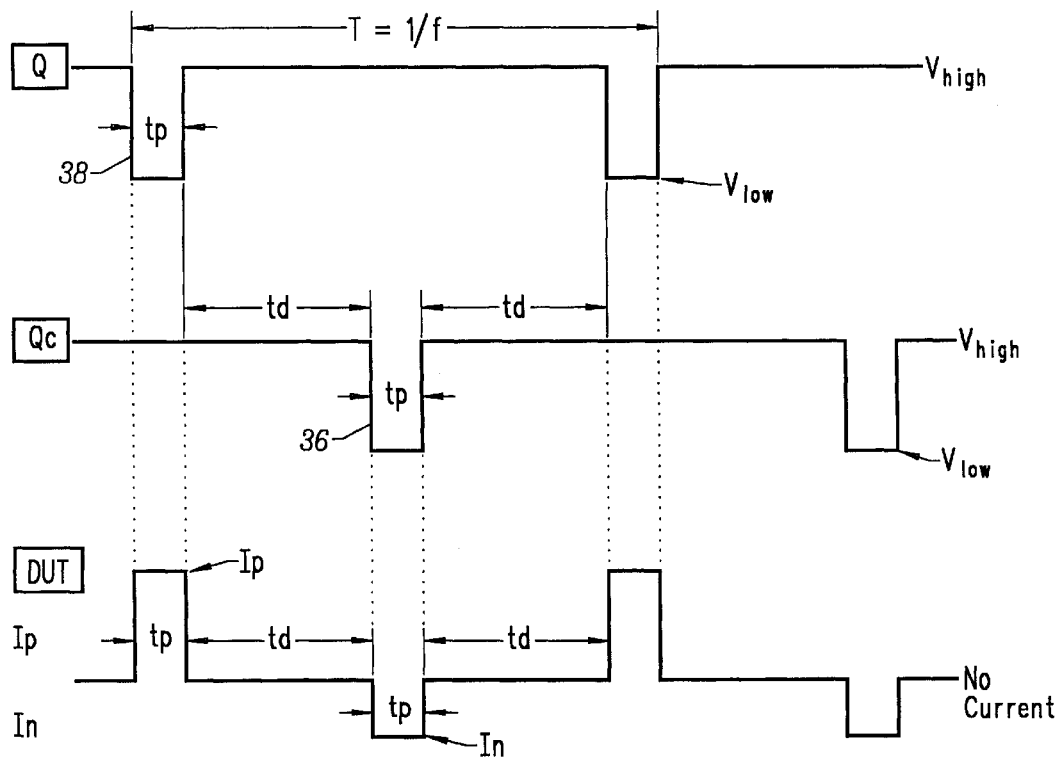
FIG. 4 illustrates bipolar current pulses generated in the test circuit of FIG. 3.

FIG. 4 illustrates the bipolar current $I_p$ and $I_n$ through DUT 32 in response to the control voltage pulses 36 and 38. The adopted nomenclature is positive current ($I_p$) flowing from node 24 through DUT 32 to node 30, and negative current ($I_n$) flowing from inode 30 through DUT 32 to node 24. When both Q and Qc are high, electronic switches 22, 28 are at their low impedance states. As a result, both currents $I_p$ and $I_n$ are shunted to circuit ground and no current flows through DUT 32. When Q is low and Qc is high, switch 22 is in a high impedance state and current $I_p$ is forced to flow into the device DUT from terminal 24 to terminal 30, while current $I_n$ continues to be shunted into circuit ground. Similarly, when Qc is low and Q is high, current $I_p$ flows into circuit ground while current $I_n$ flows into the DUT from terminal 30 to terminal 24. The result is the desirable bipolar pulse-train shown in FIG. 4. During normal operation both Q and Qc are not simultaneously low.

Electronic switches 22, 28 require careful design to assure fast and clean transition form low to high impedance state and vice versa. In principle MOS or bipolar transistors are satisfactory. However, the low impedance state is generally accompanied by a non-zero residual voltage across the switch. This implies other than perfect ground potential at the nodes of the DUT, possibly leading to some current leaks instead of perfect shunting to circuit ground.

Figure 5:
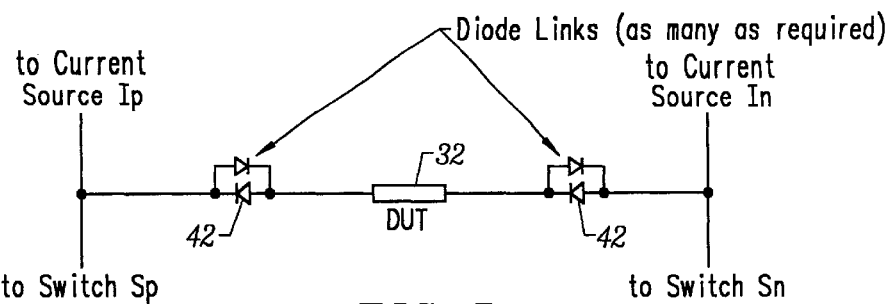
FIG. 5 illustrates an alternative embodiment of the test circuit to prevent leakage current.

FIG. 5 illustrates an alternative embodiment of the invention in which diodes 42 are serially connected with DUT 32 to limit or prevent leakage currents. As long as the residual voltage between the electronic switch and ground is less than the forward bias voltage of diode links, no undesirable current will flow into the DUT. For example, assume the voltage across an electronic switch is 0.3 volt, when switch 22 is in a low impedance state. One forward biased diode will then assure near perfect shunting of $I_p$ to ground, with the back-to-back diode arrangement providing proper operation in both current directions (i.e. Ip and In). Similarly, if the low-impedance switch voltage is higher, additional diode pairs may be added as necessary. Given the ability of a forward biased diode to carry high current levels with low bias, the penalty in terms of maximum available voltage for the DUT and wasted power is not significant.

Figure 6:
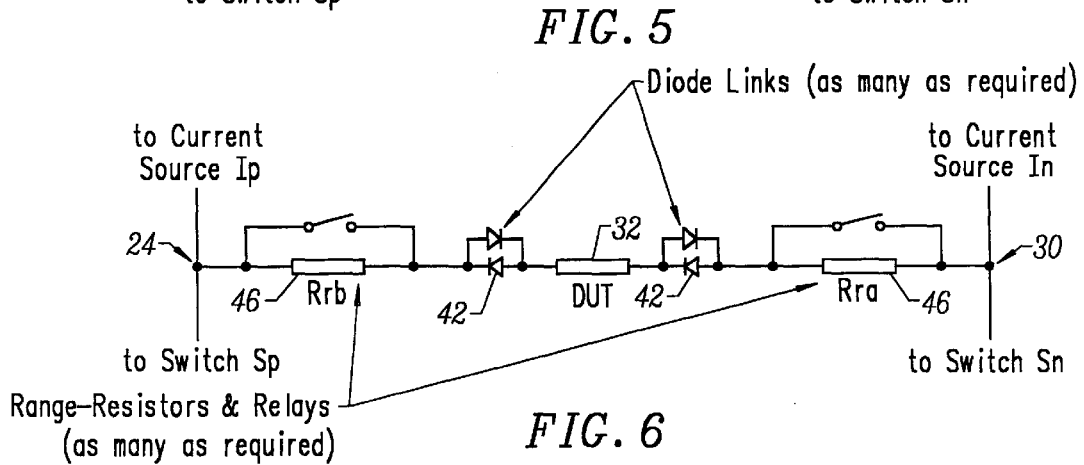
FIG. 6 illustrates schematically an embodiment of the circuit including serial resistors to limit current pulse overshoot and ringing.

Reliability tests must be performed on a variety of DUTs ranging from less than one Ohm to more than a kilo-Ohm impedance. One problem is limiting overshoot and ringing free operation under a wide range of loads. FIG. 6 is an alternative embodiment of the invention in which one or more range resistors 46 are connected in series with the DUT 32 and diode pairs 42. Each resistor can be shunted by a relay connected in parallel to assure that the total voltage across the common terminals 24, 30 (i.e. DUT+diode links+ non-shunted range-resistors) will remain within the minimum necessary level and the compliance voltage.

The test circuit in accordance with the invention provides high quality pulse current waveforms which are capable of driving a wide range of loads under a wide range of current levels all without compromising pulse quality. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A test circuit for applying bipolar current pulses to first and second terminals of a device under test (DUT) comprising:
    a) a first DC current source coupled to the first terminal,
    b) a first electronic switch coupling the first terminal to a circuit ground,
    c) a second DC current source coupled to the second terminal,
    d) a second electronic switch coupling the second terminal to a circuit ground, and
    e) a timing generator for applying a first control voltage pulse to the first electronic switch and for applying a second control voltage pulse to the second electronic switch whereby when the first control voltage pulse is applied current from the first DC current source flows through the first electronic switch to circuit ground and current from the second DC current source flows through the DUT and the first electronic switch to circuit ground, and when the second control voltage pulse is applied current from the first DC current source flows through the DUT and the second electronic switch to circuit ground and current from the second DC current source flows through the second electronic switch to circuit ground.

2. The test circuit as defined by claim 1 wherein pulse repetition rate and duty cycle of the current pulses are controlled by the control voltage pulse from the timing generator.

3. The test circuit as defined by claim 2 and further including at least one pair of back-to-back diodes serially connected with the DUT to limit leakage current through the DUT.

4. The test circuit as defined by claim 3 and further including at least one resistor serially connected with the DUT to limit current pulse overshoot and ringing.

5. The test circuit as defined by claim 2 and further including at least one resistor serially connected with the DUT to limit current pulse overshoot and ringing.

6. A method of applying bipolar current pulses to first and second terminals of a device under test (DUT) comprising the steps of
    a) providing a first DC current source and a first switch having a first common terminal,
    b) providing a second DC current source and a second switch having a second common terminal,
    c) coupling a device under test to the first and second common terminals, and
    d) selectively controlling the conductance of the first switch and the second switch whereby when the first switch is closed then current from the second DC current source flows through the device under test and the first switch, and when the second switch is closed then current from the first DC current source flows through the device under test and the second switch.

7. The method as defined by claim 6 and further including leakage current through the DUT
    a) the first switch is open and the second switch is closed, b) the first switch is closed and the second switch is open, c) when both switches are closed, by serially connecting at least one pair of back-to-back diodes with the DUT.

8. The method as defined by claim 7 and further including limiting current pulse overshoot and ringing through the DUT by serially connecting at least resistor with the DUT.

9. The method as defined by claim 6 and further including limiting current pulse overshoot and ringing through the DUT by serially connecting at least one resistor with the DUT.

10. A circuit for applying current pulses through a device under test (DUT) comprising a) a first DC current source and a first switch having a first common terminal, b) a second DC current source and second switch having a second common terminal, c) means for connecting a DUT between the first and second common terminals, and d) means for controlling the conductance of the first switch and the second switch whereby when the first switch is closed then current from the second DC current source flows through the DUT and the first switch, and when the second switch is closed the current from the first DC current source flows through the DUT and the second switch.

11. The circuit as defined by claim 10 wherein the means for controlling comprises a timing generator.

12. The circuit as defined by claim 11 wherein pulse repetition rate and duty cycle of the current pulses are controlled by the control voltage pulse from the timing generator.

13. The circuit as defined by claim 10 and further including at least one pair of reverse polarity diodes serially connected with the DUT to limit leakage current.

14. The circuit as defined by claim 13 and further including at least one resistor serially connected with the DUT to limit current pulse overshoot and ringing.

15. The circuit as defined by claim 10 and further including at least one resistor serially connected with the DUT to limit current pulse overshoot and ringing.

* * * * *